United States Patent [19]
McClure

[11] Patent Number: 5,905,683
[45] Date of Patent: May 18, 1999

[54] METHOD AND STRUCTURE FOR RECOVERING SMALLER DENSITY MEMORIES FROM LARGER DENSITY MEMORIES

[75] Inventor: David Charles McClure, Carrollton, Tex.

[73] Assignee: ST Microelectronics, Inc., Carrollton, Tex.

[21] Appl. No.: 08/940,045

[22] Filed: Sep. 29, 1997

Related U.S. Application Data

[60] Continuation of application No. 08/450,087, May 25, 1995, abandoned, which is a division of application No. 08/202,827, Feb. 28, 1994, abandoned.

[51] Int. Cl.$^6$ .................................................. G11C 7/00
[52] U.S. Cl. ................... 365/201; 365/96; 365/189.03; 365/200; 365/225.7; 365/230.08; 371/11.1
[58] Field of Search .................... 365/200, 201, 365/189.03, 225.7, 96, 230.08; 371/11.1

[56] References Cited

U.S. PATENT DOCUMENTS

| | | | |
|---|---|---|---|
| 4,446,534 | 5/1984 | Smith | 365/96 |
| 4,489,401 | 12/1984 | Smarandoiu et al. | 365/200 |
| 5,233,566 | 8/1993 | Imamiya et al. | 365/225.7 X |
| 5,293,339 | 3/1994 | Suzuki et al. | 365/225.7 X |
| 5,309,394 | 5/1994 | Wuertz et al. | 365/225.7 X |
| 5,319,592 | 6/1994 | Nguyen | 365/225.7 X |
| 5,327,381 | 7/1994 | Johnson et al. | 365/225.7 X |
| 5,337,278 | 8/1994 | Cho | 365/225.7 X |
| 5,355,344 | 10/1994 | McClure | 365/182 X |
| 5,471,431 | 11/1995 | McClure | 365/225.7 |

FOREIGN PATENT DOCUMENTS

| | | | |
|---|---|---|---|
| A-0098755 | 1/1984 | European Pat. Off. | G11C 8/00 |
| A-0544568 | 6/1993 | European Pat. Off. | G06F 11/20 |
| A-3919185 | 5/1990 | Germany | G11C 29/20 |
| A-0544568 | 2/1991 | Japan . | |

*Primary Examiner*—Do Hyun Yoo
*Attorney, Agent, or Firm*—Theodore E. Galanthay; Lisa K. Jorgenson; Renee M. Larson

[57] ABSTRACT

Therefore, according to the present invention, one or more bond pads of a memory device are connected to a corresponding address buffer or address buffers by a selection circuit which selectively allows the address buffer to ignore a signal on the bond pad. In order to define a smaller density memory device, the signal on the bond pad is ignored, and the selection circuit internally forces a logic state on the address buffer which points to the desired smaller density memory device. The memory devices and the smaller density memory devices are packaged and bonded identically and then sorted and branded such that it is not necessary to use the double inking technique. The present invention may be applied to a plurality of bond pads and corresponding address buffers. According to a preferred embodiment of the invention, the selection circuit has of a plurality of fuses which may be selectively blown to cause the address buffer to ignore a signal on the bond pad. Nonvolatile devices such as EPROM, EEPROM, Flash EPROM, or PROM devices may also be used instead of fuses. The present invention can make use of ESD transistors, or nonvolatile devices, and fuses.

10 Claims, 4 Drawing Sheets

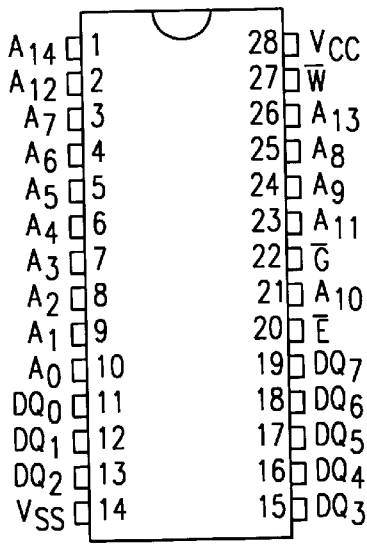
FIG. 1A
(PRIOR ART)
FIG. 1B
(PRIOR ART)
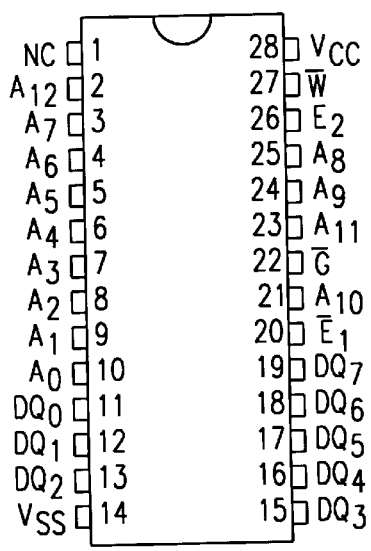
FIG. 2A
(PRIOR ART)
FIG. 2B
(PRIOR ART)

METHOD AND STRUCTURE FOR RECOVERING SMALLER DENSITY MEMORIES FROM LARGER DENSITY MEMORIES

This is a Continuation of application Ser. No. 08/450,087, filed on May 25, 1995, now abandoned, which in turn, is a Division of application Ser. No. 08/202,827 filed on Feb. 28, 1994, now abandoned.

CROSS REFERENCE TO RELATED APPLICATIONS

The subject matter of the present application is related to U.S. application, Ser. No. 08/051,184, titled "Structure to Recover a Portion of a Partially Functional Embedded Memory", now U.S. Pat. No. 5,471,431, and U.S. application, Ser. No. 07/975,628, titled "Structure for Using a Portion of an Integrated Circuit Die", now U.S. Pat. No. 5,355,344, both assigned to the assignee hereof, and both of which are herein incorporated by reference.

BACKGROUND OF THE INVENTION

The present invention relates generally to integrated circuit memories, and more specifically to a method and structure for recovering smaller densities memories from larger density memories.

Often, smaller density memory devices are packaged in the same package type, having the same number of pins and other physical dimensions, as larger density memory devices. This is true for many memory devices, including SRAMs (Static Random Access Memories), FIFO (First In First Out) memories, and tagRAMs, etc. For example, a 64K (8K×8) SRAM is typically packaged in the same package as a 256K (32K×8) SRAM. Also, the 1 Meg Burst RAM (64K×18), a data cache SRAM memory produced by SGS-Thomson Microelectronics, Inc., is packaged in the same package as the 512K Burst RAM (32K×18).

Currently manufacturers of integrated circuit memory devices do not have a satisfactory method for recovering the yield fallout of memory devices as smaller density memory devices in the same package. For, although a larger density memory device and a smaller density memory device may be housed in an identical package, bonding for the two memory devices is typically quite different. As an example, consider a 256K SRAM and a 64K SRAM. Typically, both the 256K and 64K SRAM are packaged in a 28 pin DIP or SOJ package as illustrated in FIGS. 1a and 2a, respectively. The pin names of the 28 pin package of FIGS. 1a and 2a are shown in FIGS. 1b and 2b, respectively. The 64K SRAM of FIGS. 2a and 2b has 13 address pins, or two less than the 15 address pins of the 256K SRAM of FIGS. 1a and 1b. According to FIGS. 2a and 2b, the 64K SRAM differs from the 256K SRAM because pin 1 is a No Connection (NC) pin rather than an address pin and pin 26 is a Chip Enable (E2) pin rather than an address pin. Because pins 1 and 26 of the 64K and 256K SRAMs are used for different purposes, they have different bonding connections. Otherwise, all other pins of the two devices have identical functions and thus have the same bonding connections.

Partially due to the fact that the 64K and the 256K SRAMs have different bonding connections, to date, the yield fallout of 256K SRAMs are not easily recoverable as fully functional 64K SRAMs in spite of the fact the two devices are housed in identical packaging. Additionally, even if it is possible to salvage yield fallout, sorting problems encountered with sorting the memory devices as either 256K SRAMs or 64K SRAMs may make it not practical to do so. As a result, yield fallout from larger density memory devices such as the 256K SRAM is typically scrapped rather than recovered as a fully recoverable smaller density device.

One possible solution that has been examined as a way to recover yield fallout of a larger density memory device as a small density memory device involves a double inking technique. According to the double inking technique, typically, those devices which could be recoverable as a larger density memory device are not marked, those devices which are not recoverable are marked with one ink spot, and those devices which could be recoverable as a smaller density device are marked with two ink spots during wafer testing. Thus, those devices of a 256K SRAM wafer which would be recoverable as a 64K SRAM device might be differentiated from other devices by two ink marks, rather than one or no ink marks. Then at the device assembly step, these double inked devices would be separated from the 256K devices of the wafer and bonded differently according to the bonding requirements of a smaller density 64K SRAM.

A concern with the double inking technique is that it involves many backend steps, is more expensive, and is more time consuming than traditional device handling and is subject to errors. The double inking technique is complicated further when a semiconductor manufacturer uses multiple assembly subcontractors and this, of course, complicates the manufacturing process and drives up the cost of the device.

SUMMARY OF THE INVENTION

It would be advantageous in the art to be able to recover a repairable portion of a larger density memory device as a smaller density memory device, wherein the larger density memory device and the smaller density memory device are each housed in identical packaging and have the same bonding connections.

Therefore, according to the present invention, one or more bond pads of a memory device are connected to a corresponding address buffer or address buffers by a selection circuit which selectively allows the address buffer to ignore a signal on the bond pad. In order to define a smaller density memory device, the signal on the bond pad is ignored, and the selection circuit internally forces a logic state on the address buffer which points to the desired smaller density memory device. The memory devices and the smaller density memory devices are packaged and bonded identically and then sorted and branded such that it is not necessary to use the double inking technique. The present invention may be applied to a plurality of bond pads and corresponding address buffers.

According to a preferred embodiment of the invention, the selection circuit is comprised of a plurality of fuses which may be selectively blown to cause the address buffer to ignore a signal on the bond pad. Nonvolatile devices such as EPROM, EEPROM, Flash EPROM, or PROM devices may also be used instead of fuses. The present invention can make use of ESD transistors, or nonvolatile devices, and fuses.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing, wherein:

FIG. 1a is a package diagram of a conventional 28 pin 256K SRAM;

FIG. 1b is a table showing pin names of a conventional 28 pin 256K SRAM;

FIG. 2a is a package diagram of a conventional 28 pin 64K SRAM;

FIG. 2b is a table showing pin names of a conventional 28 pin 64K SRAM;

DESCRIPTION OF THE INVENTION

The present invention provides for the recovery of smaller density memory devices from a larger density memory device wherein the larger density memory device and the smaller density memory device have identical packaging and bonding specifications. Memory devices which previously would have been discarded are recoverable as smaller density memory devices having packaging and bonding connections identical to the memory device. By appropriate manipulation of selection circuitry which resides inside the memory device, the density of a smaller density memory device may be chosen. The present invention is applicable to any number of memory devices wherein larger and smaller density memory devices typically are each housed in the same package type. SRAMs, FIFOs, and tagRAMs are all examples of memory devices where the present invention may be used.

As an example used for illustration purposes, consider a 256K SRAM and a 64K SRAM which are both housed in a 28 pin package. Those 256K SRAMs which can not be repaired have typically been discarded due to complications arising during the sorting process. However, according to the present invention, it is possible to recover yield fallout of a 256K SRAM as a 64K SRAM if the package and the bonding connections for both devices are made identical. The circuitry of FIGS. 3 and 4 provide a preferred embodiment for the recovery of a smaller density memory device from a larger density memory device while maintaining identical bonding connections.

Figure 3:
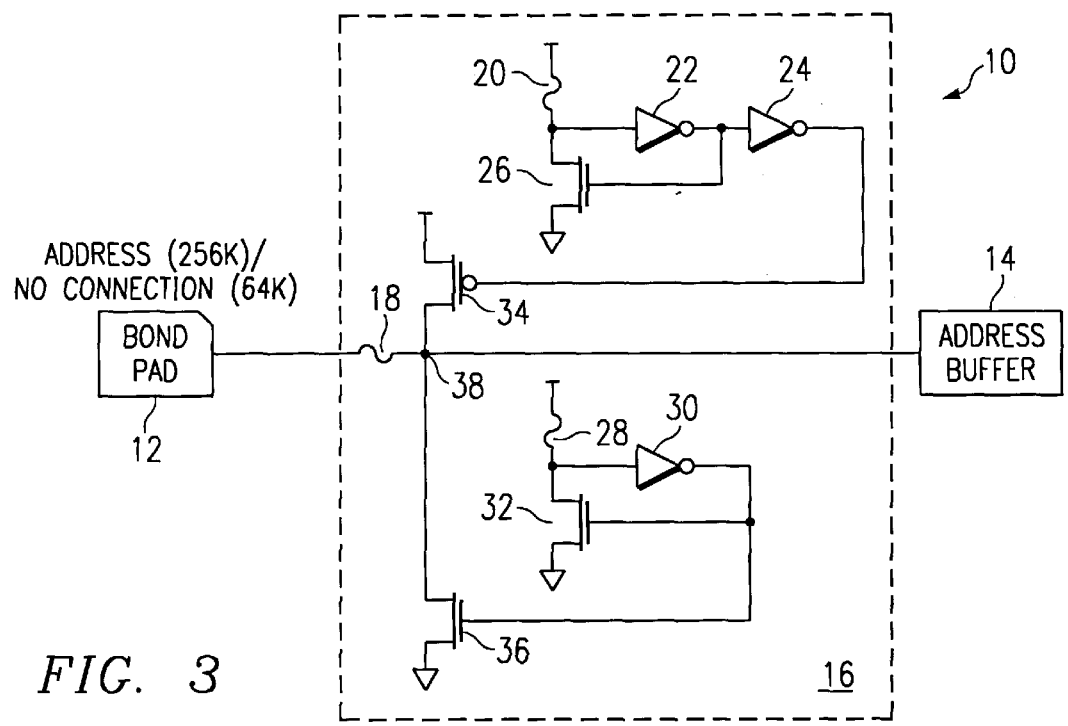
FIG. 3 is a schematic diagram of a first selection circuit, according to a preferred embodiment of the present invention.
Figure 4:
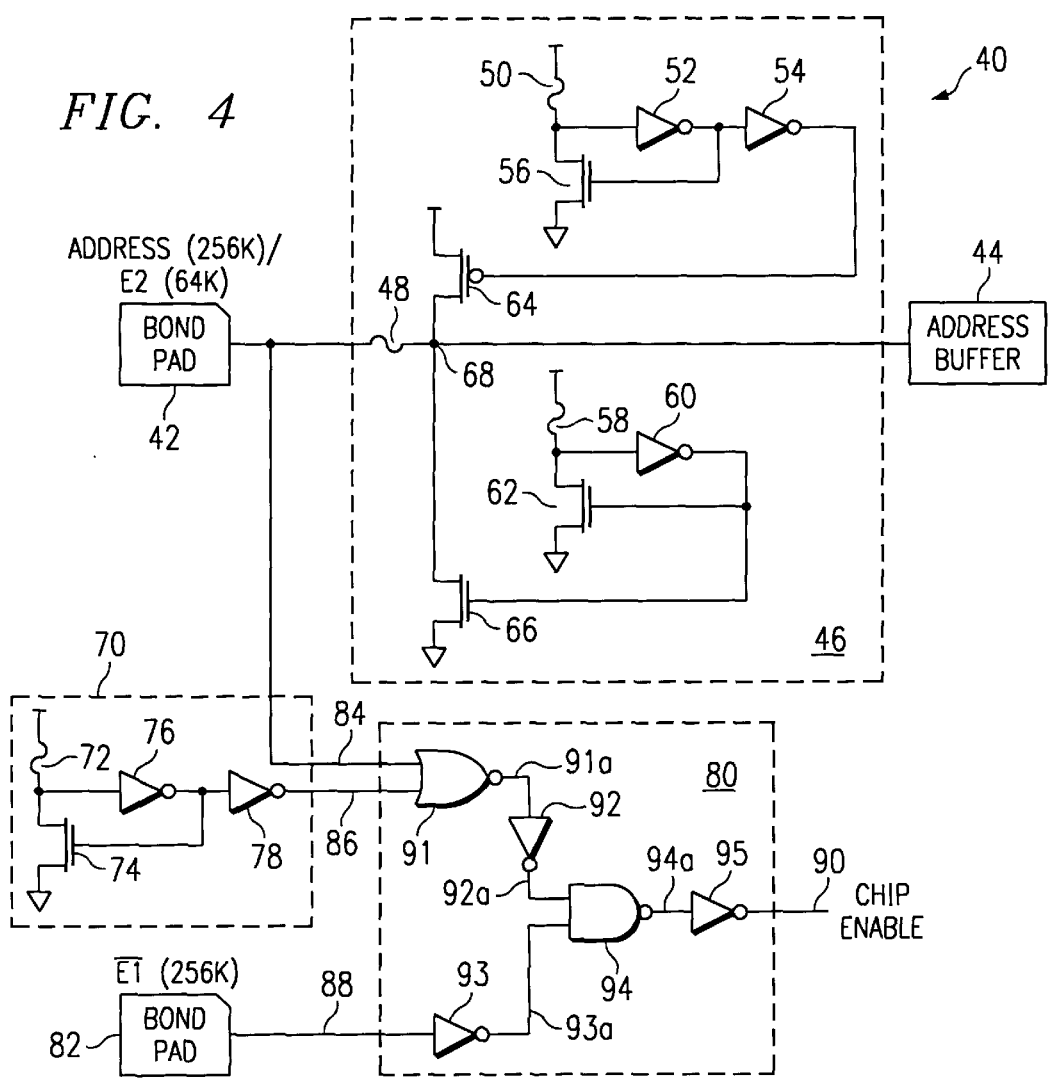
FIG. 4 is a schematic diagram of a second selection circuit, according to a first preferred embodiment of the present invention.

Referring to FIG. 3, circuitry 10 allows bond pad 12 to be selectively used as an address bond pad analogous to address pin 1 of the 256K SRAM of FIG. 1a or to be used as a No Connection bond pad analogous to No Connection pin 1 of the 64K SRAM of FIG. 2a. Bond pad 12 enjoys the same bonding connection to pin 1 regardless of whether circuitry 10 is associated with a larger density memory device, the 256K SRAM for instance, or a smaller density memory device, the 64K SRAM, for instance. Bond pad 12 may be used as the 256K address pin 1 of FIGS. 1a and 1b, or bond pad 12 may be used as the 64K No Connection (NC) pin 1 of FIGS. 2a and 2b, as a function of fuse circuitry 16 shown in dotted lines in FIG. 3. Similarly, referring to circuitry 40 of FIG. 4, the bonding connection of bond pad 42 to pin 26 is the same regardless of whether the device will be used as a 256K or a 64K device. Bond pad 42 may be used as the 256K address pin 26 of FIG. 1a, or as the 64K Chip Enable pin E2 of FIG. 2a. How bond pad 42 is used is determined as a function of fuse circuitry 46 shown inside the dotted lines in FIG. 4.

After a number of 256K SRAM devices have been tested, it can be determined which devices are fully functional or fully recoverable as 256K SRAMs. For these devices, the fuses of fuse circuitry 16 of FIG. 3 and the fuses of fuse circuitry 46 of FIG. 4 are left intact such that bond pad 12 of FIG. 3 is an address bond pad and bond pad 42 of FIG. 4 is an address bond pad as well. However, those devices which are not recoverable as a 256K device are further tested to determine if a portion, such as a quadrant, of the memory device may be salvaged as a 64K SRAM. For those devices which will be recovered as a 64K SRAM, the fuses of FIGS. 3 and 4 must be blown appropriately.

The fuse circuitry 16 of FIG. 3 is comprised of fuses 18, 20, and 28, transistors 26, 32, 34, and 36, and inverters 22, 24, and 30. Fuse 18 has a first terminal which is connected to bond pad 12 and a second terminal which is connected to node 38 which is comprised of the second terminal of fuse 18, a first source/drain terminal of transistor 34, a first source/drain terminal of transistor 36, and address buffer 14. A first terminal of fuse 20 is connected to a first terminal of inverter 22 and a first source/drain terminal of transistor 26. The second terminal of inverter 22 is connected to a first terminal of inverter 24 as well as the gate terminal of transistor 26. A second terminal of inverter 24 is connected to the gate terminal of transistor 34. Finally, a first terminal of fuse 28 is connected to a first source/drain terminal of transistor 32 and a first terminal of inverter 30. A second terminal of inverter 30 is connected to the gate terminal of transistor 32 and to the gate terminal of transistor 36. A second terminal of fuse 20, a second source/drain terminal of transistor 34, and a second terminal of fuse 28 are connected to power supply VCC. The second source/drain terminal of transistor 26, the second source/drain terminal of transistor 32, and the second source/drain terminal of transistor 36 are connected to power supply VSS.

While transistors 26, 32, and 36 are shown as n-channel transistors, and transistor 34 is shown as a p-channel transistor, one skilled in the art will recognize that the transistor type can be changed with only minor modifications to circuitry 10 without departing from the spirit and scope of the invention.

Fuse circuitry 46 and fuse circuitry 70 of FIG. 4 allow bond pad 42 to be selectively used as a 256K address pin or a 64K chip enable pin. Fuse circuitry 46 is comprised of fuses 48, 50, and 58, transistors 56, 62, 64, and 66, and inverters 52, 54, and 60. Fuse 48 has a first terminal which is connected to bond pad 42 and a second terminal which is connected to node 68 which is comprised of the second terminal of fuse 48, a first source/drain terminal of transistor 64, a first source/drain terminal of transistor 66, and address buffer 44. A first terminal of fuse 50 is connected to a first terminal of inverter 52 and a first source/drain terminal of transistor 56. The second terminal of inverter 52 is connected to a first terminal of inverter 54 as well as to the gate terminal of transistor 56. A second terminal of inverter 54 is connected to the gate terminal of transistor 64. Finally, a first terminal of fuse 58 is connected to a first source/drain terminal of transistor 62 and a first terminal of inverter 60. A second terminal of inverter 60 is connected to the gate terminal of transistor 62 and to the gate terminal of transistor 66. A second terminal of fuse 50, a second source/drain terminal of transistor 64, and a second terminal of fuse 58 are connected to power supply VCC. A second source/drain terminal of transistor 56, a second source/drain terminal of transistor 62, and a second source/drain of transistor 66 are connected to power supply VSS.

Fuse circuitry 70 is comprised of fuse 72, n-channel transistor 74, and inverters 76 and 78. As shown in FIG. 4, a first terminal of fuse 72 is connected to a first source/drain terminal of transistor 74, and a first terminal of inverter 76. A second terminal of fuse 72 and a second source/drain terminal of transistor 74 are connected to power supply VCC and VSS, respectively. A second terminal of inverter 76 is connected to a first terminal of inverter 78 and to the gate terminal of transistor 74. A second terminal of inverter 78 is connected to input buffer block 80 which is comprised of standard logic such as TTL logic and has as input signals chip enable E1 bar signal 88, inverter output signal 86 and chip enable E2 signal 84.

Input buffer block 80 performs logic on signals 84, 86, and 88 to determine, as a function of fuses 48, 50, 58, and 72, whether chip enable E2 signal 84 and chip enable E1 bar signal 88, or chip enable E1 bar signal 88 will be passed through input buffer block 80 as chip enable signal 90. Input buffer block 80 is comprised of NOR gate 91, NAND gate 94, and inverter gates 92, 93, and 95. Chip enable E2 signal 84 and inverter output signal 86 are input signals to NOR gate 91 which performs NOR logic on these signals to generate signal 91a which is inverted by inverter 92 to produce signal 92a. Chip enable E1 bar signal 88 is inverted by inverter 93 to become signal 93a. Signal 92a, the result of NORing and then inverting signals 84 and 86, and signal 93a, the inverse of signal 88, are introduced to NAND gate 94 which produces signal 94a. Signal 94a is inverted by inverter 95 to become chip enable signal 90, as shown. One skilled in the art will recognize that the logic of input buffer block 80 may be accomplished by other logic circuitry.

Referring again to FIG. 3, in order to establish bond pad 12 as a No Connection pin analogous to pin 1 of 64K SRAM of FIG. 2a, the appropriate fuses of fuse circuitry 16 must be blown. Fuse 18 is blown and then either fuse 20 or fuse 28 is blown depending on which logic state of address buffer 14 results in a fully functional or repairable 64K SRAM memory. If address buffer 14 must be a high logic level to achieve a functional or repairable memory, then fuse 20 in addition to fuse 18 is blown and transistor 34 turns on to pull address buffer 14 up to supply voltage VCC. However, if address buffer 14 must be a low logic level to achieve a functional or repairable memory, then fuse 28 in addition to fuse 18 is blown and transistor 36 turns on to pull address buffer 14 down to ground. Regardless of whether bond pad 12 is used as an address pin of a 256K SRAM or a no connection pin of a 64K SRAM, bond pad 12 is bonded to pin 1 of the memory device, and the memory device is packaged in the same package type, such as a 28 pin SOJ package.

In order to establish bond pad 42 of FIG. 4 as a chip enable E2 pin analogous to pin 26 of the 64K SRAM of FIG. 2a, the appropriate fuses of fuse circuitry 46 and fuse circuitry 70 must be blown. Fuse 48 and fuse 72 are blown and then either fuse 50 or fuse 58 is blown depending on which logic state of address buffer 44 results in a fully functional or repairable 64K SRAM memory. If address buffer 44 must be a high logic level to achieve a functional or repairable 64K memory, then fuse 50 is blown and transistor 64 turns on to pull address buffer 44 up to supply voltage VCC. However, if address buffer 44 must be a low logic level to achieve a functional or repairable 64K memory, then fuse 58 is blown and transistor 66 turns on to pull address buffer 44 down to ground. Regardless of whether bond pad 42 is used as an address pin of a 256K SRAM or a chip enable control pin of a 64K SRAM, bond pad 42 is bonded to pin 26 of the memory device, and the memory device is packaged in the same package type, such as a 28 pin SOJ package.

Thus, blowing the appropriate fuses of FIGS. 3 and 4 as described above, internally forces a logic state on address buffers 14 and 44, respectively, such that a recoverable portion of the 256K SRAM, in this case a 64K SRAM, is defined and chip enable E2 is enabled.

Figure 3A:
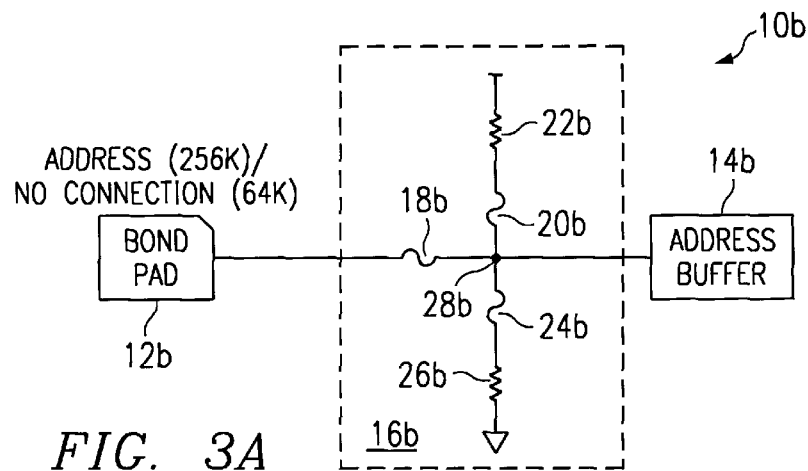
FIG. 3a is a schematic diagram of a first selection circuit, according to an alternative embodiment of the present invention.

Referring to FIG. 3a, fuse circuitry 16b may be substituted for fuse circuitry 16 of FIG. 3. Circuitry 10b allows bond pad 12b to be selectively used as an address bond pad analogous to address pin 1 of the 256K SRAM or to be used as a No Connection bond pad analogous to No Connection pin 1 of the 64K SRAM. Bond pad 12b is bonded to pin 1 of the 256K or the 64K SRAM device, and whether it is associated with an address pin or a no connection pin is a function of fuse circuitry 16b.

Fuse circuitry 16b is comprised of fuses 18b, 20b, and 24b, and resistors 22b and 26b. Fuse 18b has a first terminal which is connected to bond pad 12b and a second terminal which is connected to node 28b, which is comprised of the second terminal of fuse 18b, a first terminal of fuse 20b, a first terminal of fuse 24b, and address buffer 14b. A second terminal of fuse 20b is connected to a first terminal of resistor 22b, and a second terminal of fuse 24b is connected to a first terminal of resistor 26b. A second terminal of resistor 22b is connected to power supply VCC and a second terminal of resistor 26b is connected to power supply VSS.

In order to establish bond pad 12b as a No Connection pin analogous to pin 1 of a 64K SRAM, the appropriate fuses of fuse circuitry 16b must be blown. Fuse 18b is blown and then either fuse 20b or 24b is blown depending on which logic state of address buffer 14b results in a fully functional or repairable 64K SRAM memory. If address buffer 14b must be a high logic level to achieve a functional or repairable 64K SRAM memory, then fuse 24b in addition to fuse 18b is blown and pull-up resistor 22b pulls address buffer 14b to supply voltage VCC. If, however, address buffer 14b must be a low logic level to achieve a functional or repairable 64K SRAM memory, then fuse 20b in addition to fuse 18b is blown and pull-down resistor 26b pulls address buffer 14b to supply voltage VSS. The values chosen for pull-up resistor 22b and pull-down resistor 26b are high such that input leakage of the memory device is not exceeded; typical values of resistors 22b and 26b are in the Giga Ohm range.

Circuitry 10b of FIG. 3a is especially suited for ESD environments. Because fuse circuitry 16b does not have the transistors shown in FIG. 3, latch-up and other ESD concerns associated with transistors are not present.

Figure 3B:
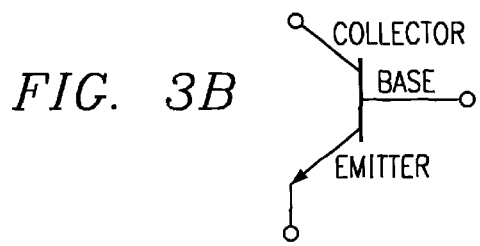
FIG. 3b is a schematic diagram of a bipolar transistor.

The present invention provides for the transistors of FIGS. 3 and 4 to be replaced with bipolar transistors. Referring to FIG. 3b, a bipolar transistor having a base, a collector, and an emitter is shown. One skilled in the art will recognize that the bipolar transistor of FIG. 3b may be used in place of the MOS transistors of FIGS. 3 and 4 with only minor changes to the circuitry, without departing from the spirit and scope of the invention.

Figure 5:
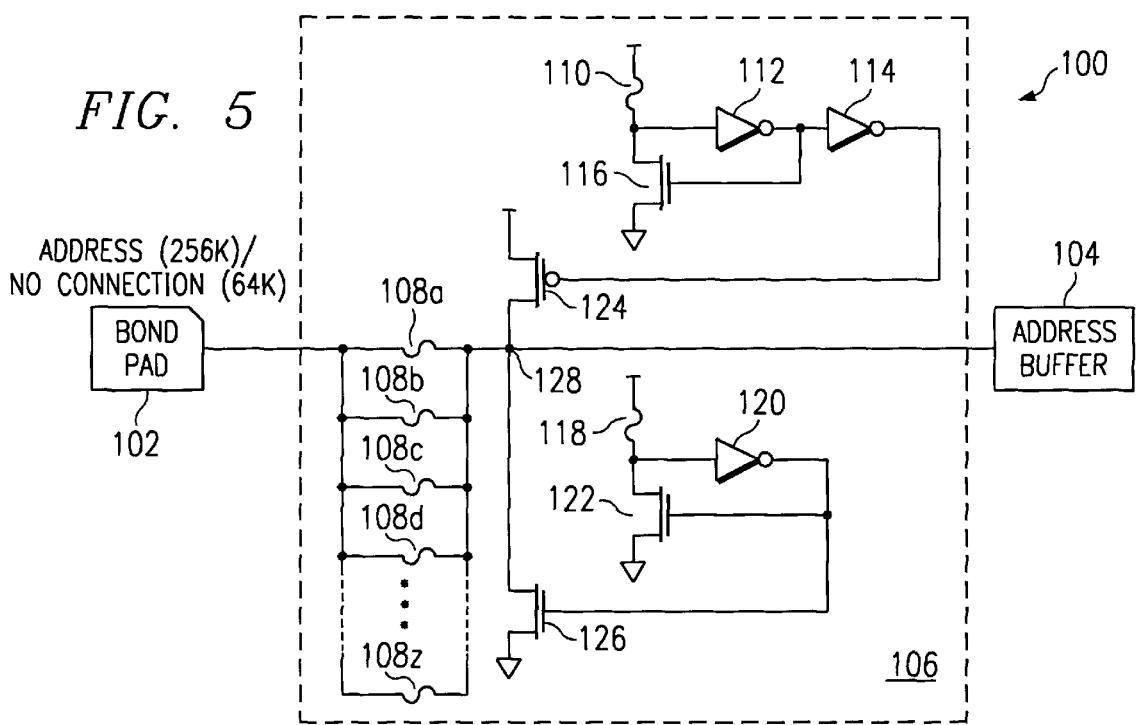
FIG. 5 is a schematic diagram in keeping with FIGS. 3, 3a, and 4 which uses ESD circuitry.

It is possible to provide enhance the operation of the circuitries of FIGS. 3, 3a, and 4 in ESD environments by using ESD protection devices, such as ESD transistors and disconnecting the bond pad from ESD structures. Referring to FIG. 5, circuitry 100, analogous to circuitry 10 of FIG. 3, is shown. However, FIG. 5 employs ESD transistors 124 and 126 and multiple fuses 108 by making use of existing ESD protection devices. Bond pad 102 is bonded to address buffer 104 through fuse circuitry 106 as shown. Fuse circuitry 106 differs from fuse circuitry 16 of FIG. 3 by providing ESD protection. In addition to fuses 110 and 118, fuse circuitry 106 has fuse 108a connected in parallel to a plurality of fuses 108b, 108c, 108d . . . 108z as shown. These multiple fuses 108 connected in parallel are capable of discharging large amounts of current in an ESD situation, and the number of fuses in parallel may vary as a function of expected ESD demands on circuitry 10. The greater the number of fuses 108 connected to each other in parallel, the greater the amount of current which circuitry 100 can successfully handle.

A first terminal of each of fuses 108a, 108b, 108c, 108d . . . 108z is connected in series to bond pad 12 and fuses 108a . . . 108z are connected in parallel to each other. A second terminal of each of fuses 108a . . . 108z is connected to node 128 which is comprised of the second terminal of fuses 108a, 108b, 108c, 108d . . . 108z, a first source/drain terminal of transistor 124, a first source/drain terminal of transistor 126, and address buffer 104. A first terminal of fuse 110 is connected to a first terminal of inverter 112 and a first source/drain terminal of transistor 116. A second terminal of inverter 112 is connected to a first terminal of inverter 114 as well as to the gate terminal of transistor 116. A second terminal of inverter 114 is connected to the gate terminal of ESD transistor 124. Finally, a first terminal of fuse 118 is connected to a first source/drain terminal of transistor 122 and a first terminal of inverter 120. A second terminal of inverter 120 is connected to the gate terminal of transistor 122, the gate terminal of ESD transistor 126. A second source/drain terminal of ESD transistor 124, a second terminal of fuse 110, and a second terminal of fuse 118 are connected to power supply VCC. A second source/drain terminal of transistor 116, a second source/drain terminal of transistor 122, and a second source/drain of ESD transistor 126 are connected to power supply VSS.

As in FIG. 3, the fuses of fuse circuitry 106 which are to be blown is determined by whether bond pad 102 is to be treated as an address pad suitable for a 256K SRAM or as a No Connection pad suitable for a 64K SRAM. For a 256K SRAM, the fuses of fuse circuitry 106 are left intact. In order to use bond pad 102 as a 64K No connection bond pad, fuse 108a and all fuses connected in parallel to fuse 108a, such as 108b, 108c, 108d . . . 108z, are blown. Then, either fuse 110 or fuse 118, in addition to fuses 108a . . . 108z, is blown depending on which logic state of address buffer 104 results in a fully functional or repairable 64K memory. If address buffer 104 must be a high logic level to achieve a functional or repairable memory, then fuses 108 and 110 are blown and ESD transistor 124 turns on to pull address buffer 104 up to supply voltage VCC. However, if address buffer 104 must be a low logic level to achieve a functional or repairable 64K memory, then fuses 108 and 118 are blown and n-channel transistor 126 turns on to pull address buffer 104 down to ground.

The ESD transistors shown in fuse circuitry 106 of FIG. 5 may be similarly applied to fuse circuitry 46 and fuse circuitry 70 of FIG. 4 in order make use of existing ESD circuitry and to disconnect bond pads 42 and 82 from the ESD circuitry.

Figure 6:
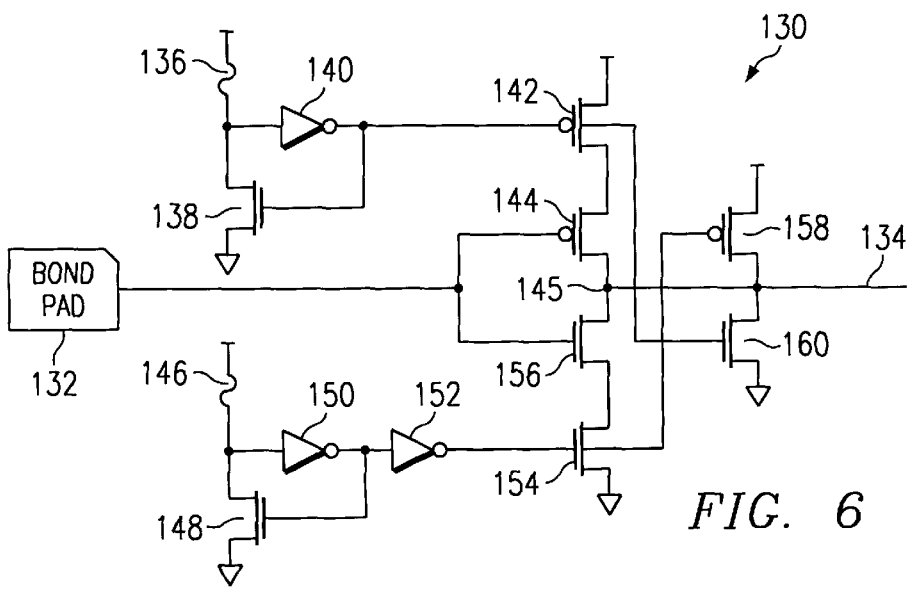
FIG. 6 is a schematic diagram of a selection circuitry, according to an alternate preferred embodiment of the present invention.

Referring to FIG. 6, an alternate preferred embodiment of the present invention is shown. Circuitry 130 combines fuse circuitry with input buffer circuitry, comprised of transistors 142, 144, 154, and 156, to selectively use bond pad 132 as a 256K SRAM address bond pad or as a 64K SRAM No Connection bond pad. Bond pad 132 is connected to the gate terminals of transistor 144 and transistor 156, and signal 134 is connected to a common node 145 formed by a second source/drain terminal of transistor 144, a first source/drain terminal of transistor 156, a first source/drain terminal of transistor 158, and a first source/drain terminal of transistor 160, as shown. A first terminal of fuse 136 is connected to a first source/drain terminal of transistor 138 and a first terminal of inverter 140. A second terminal of inverter 140 is connected to the gate terminal of transistor 138 and the gate terminals of transistor 142 and transistor 160. A first source/drain terminal of transistor 142 is connected to a first source/drain terminal of transistor 144. A first terminal of fuse 146 is connected to a first source/drain terminal of transistor 148 and a first terminal of inverter 150. A second terminal of inverter 150 is connected to the gate terminal of transistor 148 and a first terminal of inverter 152. A second terminal of inverter 152 is connected to the gate terminals of transistor 154 and transistor 158. A first source/drain terminal of transistor 154 is connected to the second source/drain terminal of transistor 156. A second terminal of fuse 136, a second terminal of fuse 146, a second source/drain terminal of transistor 142, and a second source/drain terminal of transistor 158 are connected to power supply VCC. A second source/drain terminal of transistor 138, a second source/drain terminal of transistor 148, a second source/drain terminal of transistor 154, and a second source/drain terminal of transistor 160 are connected to power supply VSS.

The appropriate fuses of circuitry 130 are blown to emulate signal 134 locked to a high or a low logic state. In effect, fuses 136 and 146 may be used to control the input buffer circuitry, comprised of transistors 142, 144, 154 and 156, by selectively blowing fuse 136 or fuse 146. Fuse 136 is blown to emulate bond pad 132 locked to a high logic state, while fuse 146 is blown to emulate bond pad 132 locked to a low logic state. While circuitry 130 uses fewer fuses than FIGS. 3, 4, and 5, it also uses more transistors and series devices, including transistors, which may have the effect of slowing signal propagation through circuitry 130.

FIGS. 3, 4, 5, and 6 have demonstrated how fuses and fuse circuitry may be used to selectively determine the functionality of a bond pad, whether it be an address bond pad, a chip enable bond pad, or a No Connection bond pad. In addition to fuses, the present invention may employ nonvolatile elements such as PROM (programmable read only memory), EPROM (erasable programmable read only memory), EEPROM (electrically erasable programmable read only memory), and Flash EEPROM devices.

Figures 7A, 7B:
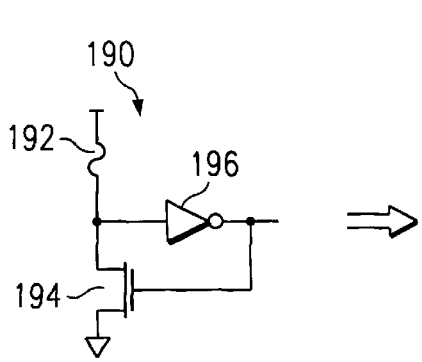
FIG. 7a is fuse circuitry and FIG. 7b is EEPROM transistor circuitry with a resistive element which may replace the fuse circuitry of FIG. 7a, according to the present invention.

Referring to FIGS. 7a and 7b, examples of EEPROM transistor circuitry which may be used in lieu of the fuse circuitries of FIGS. 3, 3a, 4, 5, and 6 are shown. FIG. 7a shows fuse circuitry 170, comprised of fuse 172, transistor 174, and inverter 176, consistent with the fuse circuitries used in FIGS. 3, 3a, 4, 5, and 6. According to the present invention, fuse circuitry 170 may be replaced with simple EEPROM transistor circuitry 180 shown in FIG. 7b having a resistor 182, EEPROM transistor 184, and inverter 186. A first terminal of resistor 182 is connected to a first source/drain terminal of EEPROM transistor 184 and a first terminal of inverter 186. The gate terminal of EEPROM transistor 184 and a second terminal of resistor 182 are connected to power supply VCC. A second source/drain terminal of EEPROM transistor 184 is connected to supply voltage VSS. To mimic blowing a fuse, EEPROM transistor circuitry 180 is programmed with a low threshold voltage.

Figures 8A, 8B:
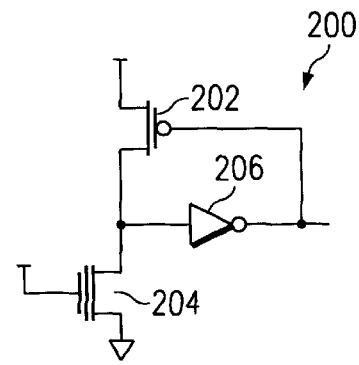
FIG. 8a is fuse circuitry and FIG. 8b is EEPROM transistor circuitry with a resistive transistor element which may replace the fuse circuitry of FIG. 8a, according to the present invention.

FIG. 8a shows fuse circuitry 190 consistent with the fuse circuitries of FIGS. 3, 3a, 4, 5, and 6. Fuse circuitry 190 has a fuse 192, a transistor 194, and an inverter 196 analogous to the fuse circuitries of FIGS. 3, 3a, 4, 5, and 6, and may be replaced with EEPROM transistor circuitry 200 of FIG. 8b. EEPROM transistor circuitry 200 is comprised of transistor 202, EEPROM transistor 204 and inverter 206. A first source/drain terminal of transistor 202 is connected to a first terminal of inverter 206 and a first source/drain terminal of EEPROM transistor 204. The gate terminal of transistor 202 is connected to a second terminal of inverter 206 as shown. A second source/drain terminal of transistor 202 and the gate terminal of EEPROM transistor 204 are connected to power supply VCC, while a second source/drain terminal of EEPROM transistor 204 is connected to supply voltage VSS as shown. EEPROM transistor 204 is typically a stronger transistor than transistor 202 and thus able to handle more current. EEPROM transistor 204 is programmed with a low threshold voltage to mimic blowing a fuse.

A major advantage of the present invention is that in utilizing unrecoverable larger density memory devices as smaller density memory devices, the quantity of available redundant elements does not correspondingly decrease if the fuse controlled address being forced to a logic state does not reduce the number of available redundant elements. Thus, the redundant elements of a 256K SRAM memory are available to a 64K SRAM which is recovered from it.

As discussed above, after it is has been determined that a memory device is not repairable as a 256K device but is repairable as a 64K SRAM, the appropriate fuses are blown to define a 64K SRAM with identical packaging and bonding to the 256K SRAM. Next, memory devices having the selection circuitry according to the present invention are sorted during testing, typically at preburn/speed sort, to determine if the memory device has retained its original density or if it has been reduced in density to a smaller density memory device. For example, a 256K SRAM is tested to determine if it is a 256K SRAM or if it is a 64K SRAM recovered from a 256K SRAM. In the 256K/64K SRAM example of FIGS. 3 and 4, the 256K device is first tested in an enable state with E bar pin 20 at a low logic state and address 13 pin 26 at a logic low level. If the output pins, DQ0–DQ7 shown in FIG. 1a, leak, indicative of a low impedance condition, then the device is a 256K SRAM; if the output pins do not leak, indicative of a high impedance condition, then the device is a 64K SRAM since pin 26 is at a low logic level (E2) which disables the device. The device is then tested based on whether it is a 256K SRAM or a 64K SRAM, binned and branded appropriately. Thus, according to the present invention, the die of a memory device is correctly identified without use of the problematic double inking technique or other complicated methods, and are then sorted after packaging through test means. Packaging is simple because all devices use identical packaging and bonding. Previously, the no connection pin for a 64K SRAM was not bonded at all and the chip enable pin for a 64K SRAM was bonded to a different bond pad than for a 256K SRAM. The present invention allows pin 1 of the 64K SRAM, a no connection pin, and pin 1 of the 256K SRAM, an address pin, to be bonded to the same bond pad.

While the invention has been particularly shown and described with reference to a preferred embodiment, it will be understood by those skilled in the art that various changes in form and detail may be made therein without departing from the spirit and scope of the invention. For example, the present invention is also well suited for the 1 Meg Burst RAM and the 512 Burst RAM manufactured by SGS-Thomson Microelectronics, Inc. Similar to the 256 SRAM/64K SRAM, the 512 Burst RAM is identical to the 1 Meg Burst RAM except that one pin is a no connection pin rather than an address pin. For the Burst RAM, it is only necessary to control one address in order to define the smaller density 512 Burst RAM from the 1 Meg Burst RAM. Because the Burst RAM is a larger density device than the 256K/64K SRAM discussed herein, more benefit from recovering yield fallout using the present invention is realized.

What is claimed is:

1. A method for recovering a smaller density memory from a larger density memory, comprising the steps of:

testing a memory device to determine that the memory device will be recovered as a smaller density memory device;

determining an appropriate logic state for at least a first address buffer connected to a first bond pad of the memory device, wherein the appropriate logic state for the first address buffer defines the smaller density memory device; and selectively causing the first address buffer to ignore a first signal on the first bond pad so that the appropriate logic state for the first address buffer is maintained on the first address buffer and the smaller density memory device is defined;

wherein a first selection circuit comprises a disconnect means connected in series with the first bond pad for selectively causing the first address buffer to ignore the first signal on the first bond pad, and a programmable means, connected to a pull-up/pull-down component, for maintaining the appropriate logic state on the first address buffer upon selectively causing the first address buffer to ignore the first signal on the first bond pad; and wherein the disconnect means is a fuse and the programmable means is a EEPROM transistor and the fuse is blown to cause the first address buffer to ignore the first signal on the first bond pad and the EEPROM transistor is programmed to maintain the appropriate logic state on the first address buffer.

2. A method for recovering a smaller density memory from a larger density memory, comprising the steps of:

testing a memory device to determine that the memory device will be recovered as a smaller density memory device;

determining an appropriate logic state for at least a first address buffer connected to a first bond pad of the memory device, wherein the appropriate logic state for the first address buffer defines the smaller density memory device; and selectively causing the first address buffer to ignore a first signal on the first bond pad so that the appropriate logic state for the first address buffer is maintained on the first address buffer and the smaller density memory device is defined;

wherein a first selection circuit comprises a disconnect means connected in series with the first bond pad for selectively causing the first address buffer to ignore the first signal on the first bond pad, and a programmable means, connected to a pull-up/pull-down component, for maintaining the appropriate logic state on the first address buffer upon selectively causing the first address buffer to ignore the first signal on the first bond pad; and wherein the disconnect means is a EEPROM transistor, and the EEPROM transistor is programmed to cause the first address buffer to ignore the first signal on the first bond pad.

3. A method for recovering a smaller density memory from a larger density memory, comprising the steps of:

testing a memory device to determine that the memory device will be recovered as a smaller density memory device;

determining an appropriate logic state for at least a first address buffer connected to a first bond pad of the memory device, wherein the appropriate logic state for the first address buffer defines the smaller density memory device; and selectively causing the first address buffer to ignore a first signal on the first bond pad so that the appropriate logic state for the first address buffer is maintained on the first address buffer and the smaller density memory device is defined;

wherein a first selection circuit comprises a disconnect means connected in series with the first bond pad for selectively causing the first address buffer to ignore the first signal on the first bond pad, and a programmable means, connected to a pull-up/pull-down component, for maintaining the appropriate logic state on the first address buffer upon selectively causing the first address buffer to ignore the first signal on the first bond pad, and wherein the pull-up/pull-down component is a ESD transistor.

4. A method for recovering a smaller density memory from a larger density memory, comprising the steps of:

testing a memory device to determine that the memory device will be recovered as a smaller density memory device;

determining an appropriate logic state for at least a first address buffer connected to a first bond pad of the memory device, wherein the appropriate logic state for the first address buffer defines the smaller density memory device; and selectively causing the first address buffer to ignore a first signal on the first bond pad so that the appropriate logic state for the first address buffer is maintained on the first address buffer and the smaller density memory device is defined;

wherein a first selection circuit comprises a disconnect means connected in series with the first bond pad for selectively causing the first address buffer to ignore the first signal on the first bond pad, and a programmable means, connected to a pull-up/pull-down component for maintaining the appropriate logic state on the first address buffer upon selectively causing the first address buffer to ignore the first signal on the first bond pad, and wherein the first selection circuit comprises a plurality of nonvolatile devices which selectively cause the first address buffer to ignore the first signal on the first bond pad.

5. The method of claim 4, wherein the nonvolatile devices are EPROM (erasable programmable read only memory), EEPROM (electrically erasable programmable read only memory), Flash EPROM (erasable programmable read only memory), or PROM (programmable read only memory) devices.

6. A method for recovering a smaller density memory from a larger density memory, comprising the steps of:

testing a memory device to determine that the memory device will be recovered as a smaller density memory device;

determining an appropriate logic state for at least a first address buffer connected to a first bond pad of the memory device, wherein the appropriate logic state for the first address buffer defines the smaller density memory device; and selectively causing the first address buffer to ignore a first signal on the first bond pad so that the appropriate logic state for the first address buffer is maintained on the first address buffer and the smaller density memory device is defined;

wherein a first selection circuit comprises a disconnect means connected in series with the first bond pad for selectively causing the first address buffer to ignore the first signal on the first bond pad, and a programmable means, connected to a pull-up/pull-down component, for maintaining the appropriate logic state on the first address buffer upon selectively causing the first address buffer to ignore the first signal on the first bond pad, and wherein the first selection circuit provides ESD protection and has at least a first ESD protection device.

7. A method for recovering a smaller density memory from a larger density memory, comprising the steps of:

testing a memory device to determine that the memory device will be recovered as a smaller density memory device;

determining an appropriate logic state for at least a first address buffer connected to a first bond pad of the memory device, wherein the appropriate logic state for the first address buffer defines the smaller density memory device; and selectively causing the first address buffer to ignore a first signal on the first bond pad so that the appropriate logic state for the first address buffer is maintained on the first address buffer and the smaller density memory device is defined;

wherein a first selection circuit comprises a disconnect means connected in series with the first bond pad for selectively causing the first address buffer to ignore the first signal on the first bond pad, and a programmable means, connected to a pull-up/pull-down component, for maintaining the appropriate logic state on the first address buffer, and wherein the first selection circuit comprises a plurality of nonvolatile devices which selectively cause the first address buffer to ignore the first signal on the first bond pad.

8. The method of claim 7, wherein the nonvolatile devices are EPROM (erasable programmable read only memory), EEPROM (electrically erasable programmable read only memory), Flash EPROM (erasable programmable read only memory), or PROM (programmable read only memory) devices.

9. A method for recovering a smaller density memory from a larger density memory, comprising the steps of:

testing a memory device to determine that the memory device will be recovered as a smaller density memory device;

determining an appropriate logic state for at least a first address buffer connected to a first bond pad of the memory device, wherein the appropriate logic state for the first address buffer defines the smaller density memory device; and selectively causing the first address buffer to ignore a first signal on the first bond pad so that the appropriate logic state for the first address buffer is maintained on the first address buffer and the smaller density memory device is defined;

wherein a first selection circuit comprises a disconnect means connected in series with the first bond pad for selectively causing the first address buffer to ignore the first signal on the first bond pad, and a programmable means, connected to a pull-up/pull-down component, for maintaining the appropriate logic state on the first address buffer, and wherein the first selection circuit provides ESD protection and has at least a first ESD protection device.

10. A method for recovering a smaller density memory from a larger density memory, comprising the steps of:

testing a memory device to determine that the memory device will be recovered as a smaller density memory device;

determining an appropriate logic state for at least a first address buffer connected to a first bond pad of the memory device, wherein the appropriate logic state for the first address buffer defines the smaller density memory device; and selectively causing the first address buffer to ignore a first signal on the first bond pad so that the appropriate logic state for the first address buffer is maintained on the first address buffer and the smaller density memory device is defined;

wherein for the memory device the first bond pad is representative of an address pin, and for the smaller density device the first bond pad is representative of a control pin that is a chip enable pin.

* * * * *

UNITED STATES PATENT AND TRADEMARK OFFICE
CERTIFICATE OF CORRECTION

PATENT NO. : 5,905,683
DATED : May 18, 1999
INVENTOR(S) : McClure

It is certified that error appears in the above-identified patent and that said Letters Patent is hereby corrected as shown below:

Title page, item [22] delete September 29, 1997 and insert --May 15, 1997--

Signed and Sealed this

Eleventh Day of January, 2000

Attest:

Q. TODD DICKINSON

Attesting Officer    Acting Commissioner of Patents and Trademarks